US006794259B2

(12) United States Patent
Lichter

(10) Patent No.: US 6,794,259 B2
(45) Date of Patent: Sep. 21, 2004

(54) METHOD FOR FABRICATING SELF-ALIGNING MASK LAYERS

(75) Inventor: Gerd Lichter, Radeburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/200,707

(22) Filed: Jul. 22, 2002

(65) Prior Publication Data

US 2003/0017668 A1 Jan. 23, 2003

(30) Foreign Application Priority Data

Jul. 20, 2001 (EP) ............................................ 01117545

(51) Int. Cl.[7] .............................................. H01L 21/20
(52) U.S. Cl. ...................... 438/391; 438/248; 438/437; 438/445
(58) Field of Search ................................ 438/386, 391, 438/243, 248, 437, 445, 444, 705–733, 735, 743, 723

(56) References Cited

U.S. PATENT DOCUMENTS

| | | | |
|---|---|---|---|
| 4,679,299 A | | 7/1987 | Szluk et al. |
| 5,618,751 A | | 4/1997 | Golden et al. |
| 5,945,704 A | | 8/1999 | Schrems et al. |
| 6,015,985 A | * | 1/2000 | Ho et al. .................... 257/301 |
| 6,063,657 A | * | 5/2000 | Bronner et al. ............. 438/244 |
| 6,063,693 A | * | 5/2000 | Soderbarg et al. .......... 438/432 |
| 6,100,132 A | * | 8/2000 | Sato et al. .................. 438/243 |
| 6,150,212 A | * | 11/2000 | Divakaruni et al. ......... 438/244 |
| 6,204,112 B1 | * | 3/2001 | Chakravarti et al. ........ 438/243 |
| 6,232,171 B1 | * | 5/2001 | Mei ........................... 438/246 |
| 6,291,357 B1 | * | 9/2001 | Zhang et al. ............... 438/714 |
| 6,319,788 B1 | * | 11/2001 | Gruening et al. ........... 438/386 |
| 6,373,086 B1 | * | 4/2002 | Mandelman et al. ........ 257/301 |
| 6,391,706 B2 | * | 5/2002 | Wu et al. .................... 438/243 |
| 6,399,976 B1 | * | 6/2002 | Geiss et al. ................. 257/301 |
| 6,437,381 B1 | * | 8/2002 | Gruening et al. ........... 257/296 |
| 6,440,813 B2 | * | 8/2002 | Collins et al. .............. 438/386 |
| 6,566,273 B2 | * | 5/2003 | Kudelka ..................... 438/733 |
| 6,600,189 B1 | * | 7/2003 | Sato et al. .................. 257/301 |

FOREIGN PATENT DOCUMENTS

JP    62202555 A   *  9/1987
JP    410163573 A  *  6/1998

OTHER PUBLICATIONS

Proksche, H. et al.: "The Influence of $NH_4F$ on the Etch Rates of Low Pressure Chemical Vapor Deposition Arcenosilicate Glasses in Buffered Oxide Etch", Journal of the Electrochemical Society, No. 12, Dec. 1993, pp. 3611–3615.
Proksche, H. et al.: "The Influence of $NH_4F$ on the Etch Rates of Undoped $SiO_2$ in Buffered Oxide Etch", Journal of the Electrochemical Society, No. 2, Feb. 1992, pp. 521–524.

* cited by examiner

*Primary Examiner*—Amir Zarabian
*Assistant Examiner*—Khanh Duong
(74) *Attorney, Agent, or Firm*—Laurence A. Greenberg; Werner H. Stemer; Ralph E. Locher

(57) ABSTRACT

A method for fabricating a self-aligning mask layer includes the steps of forming a surface to be masked in a carrier substrate, the surface having different radii of curvature, forming an undensified conformal insulation layer on the surface such that, on account of the different radii of curvature, regions with different mechanical stress are produced in the insulation layer, and carrying out an etching-back to remove partial regions of the insulation layer in a manner dependent on the different mechanical stress in the insulation layer.

21 Claims, 9 Drawing Sheets

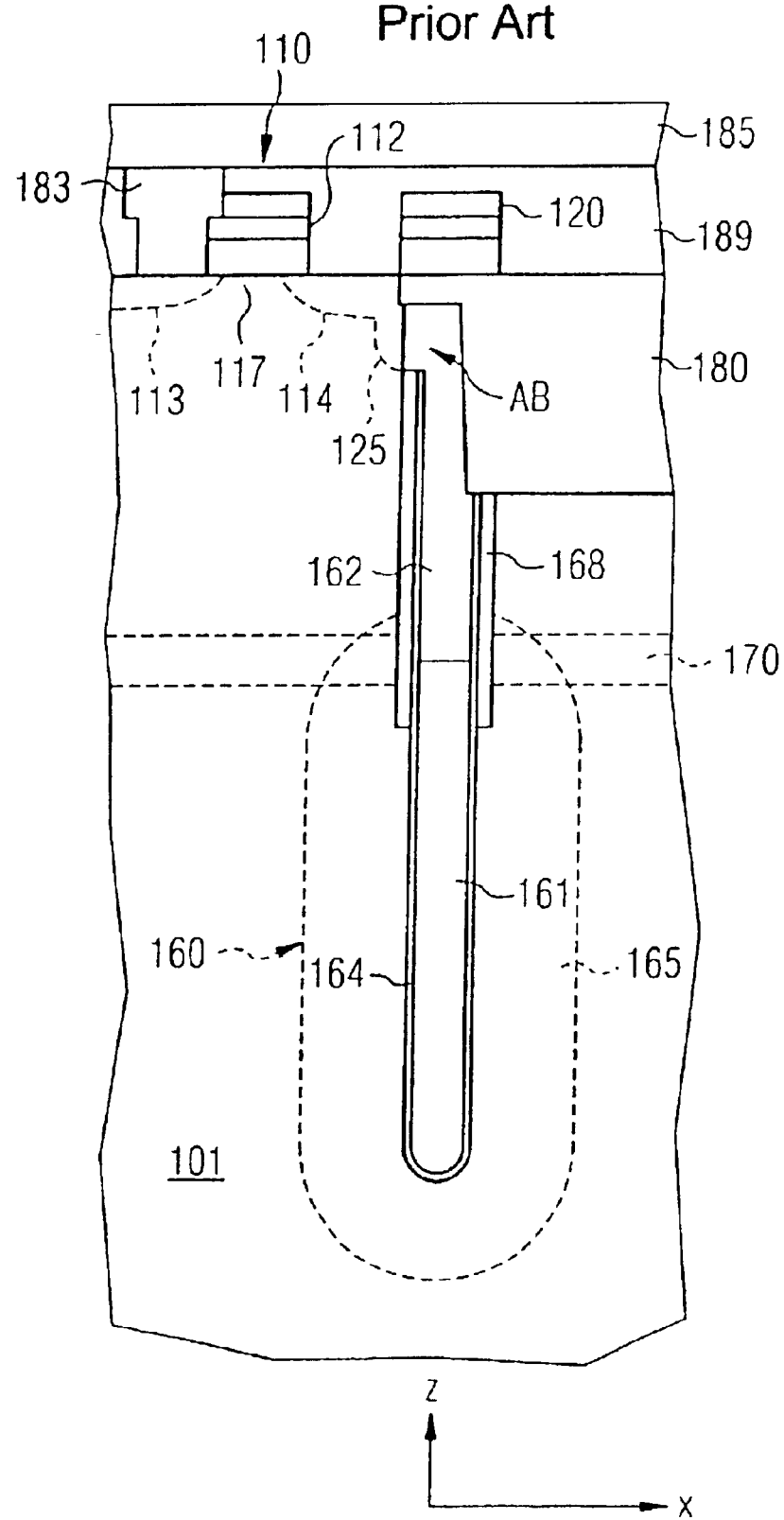

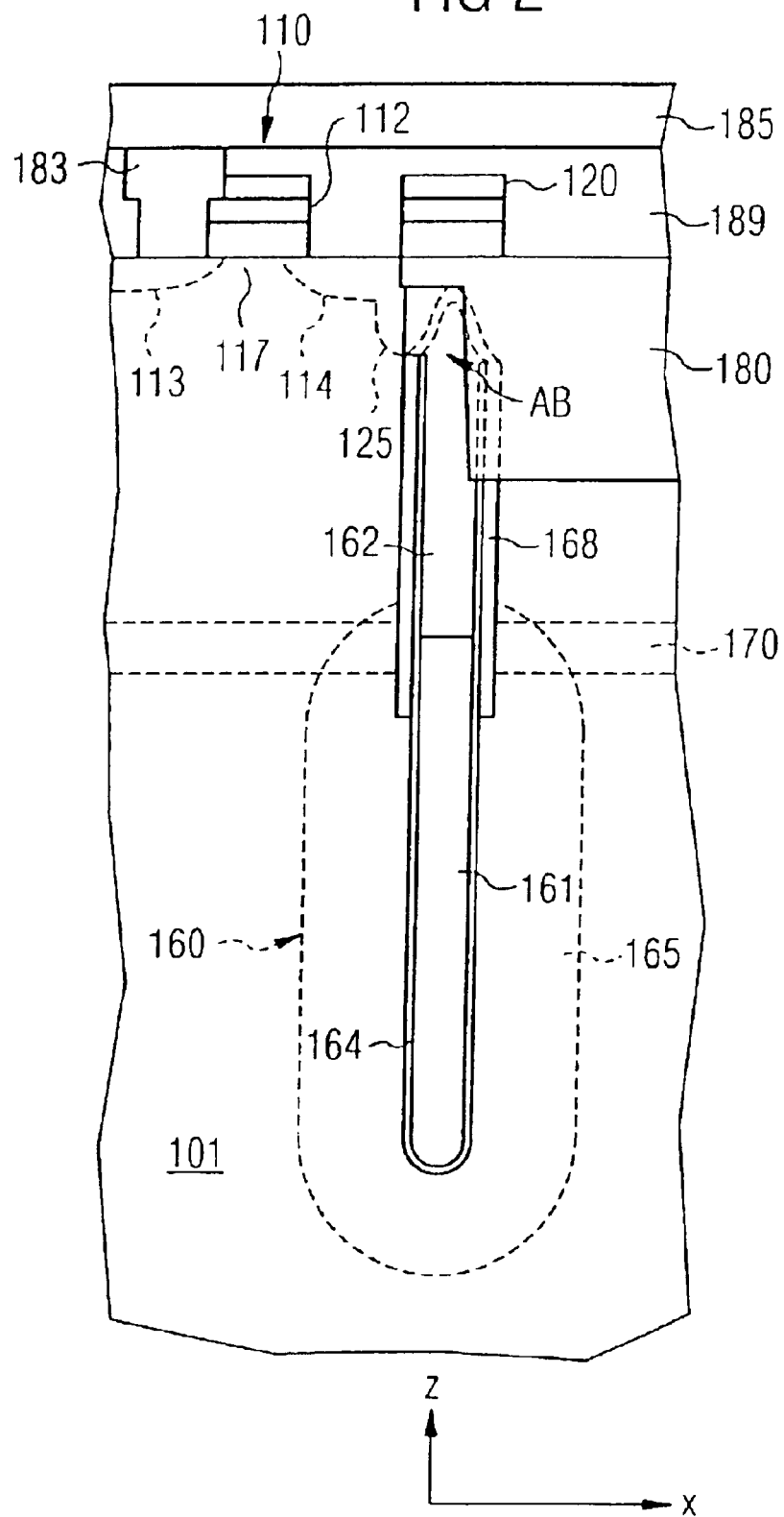

II-II'

I-I'

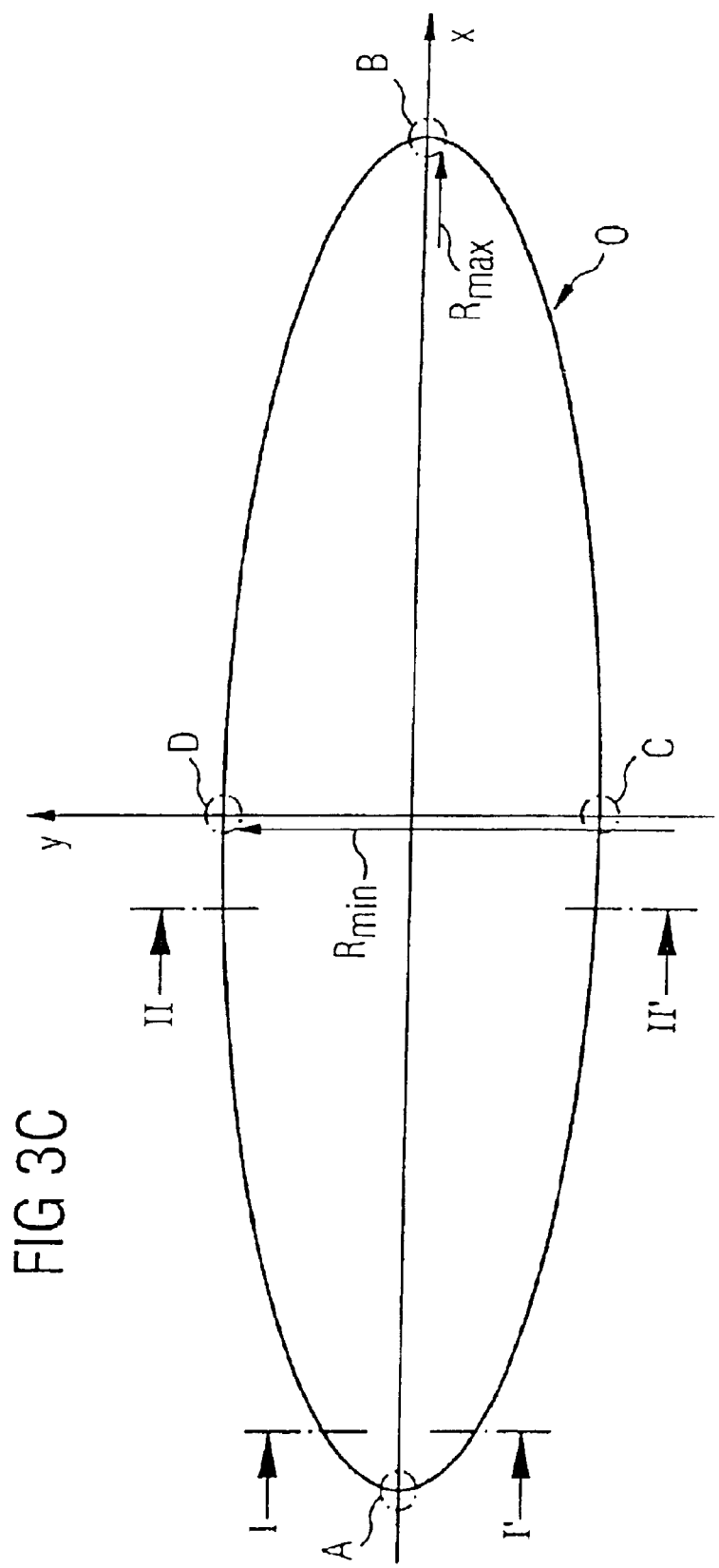

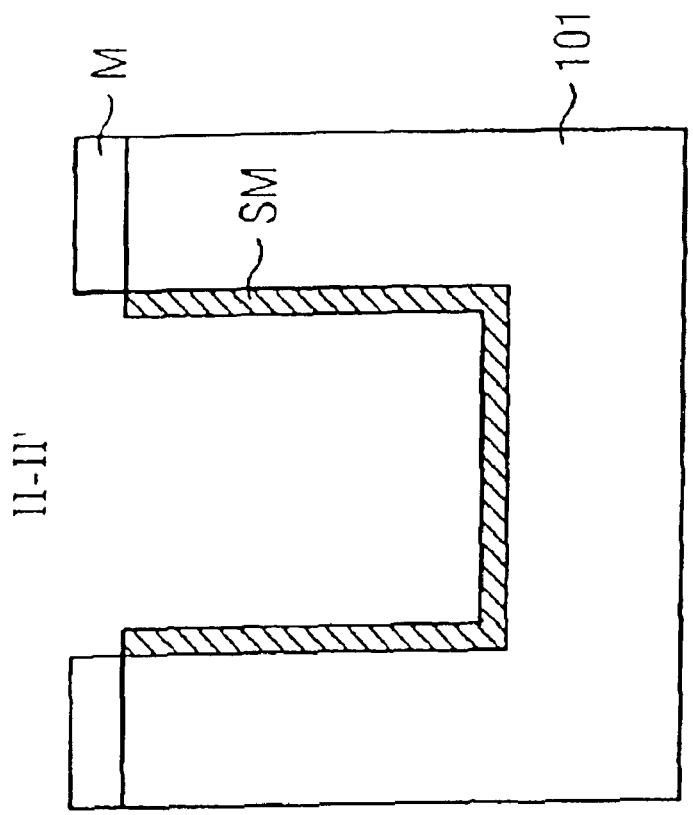
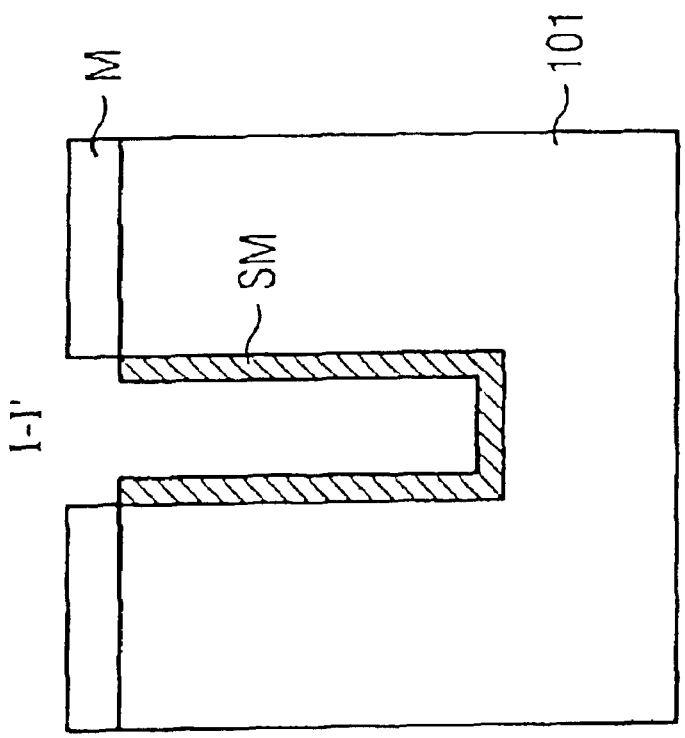

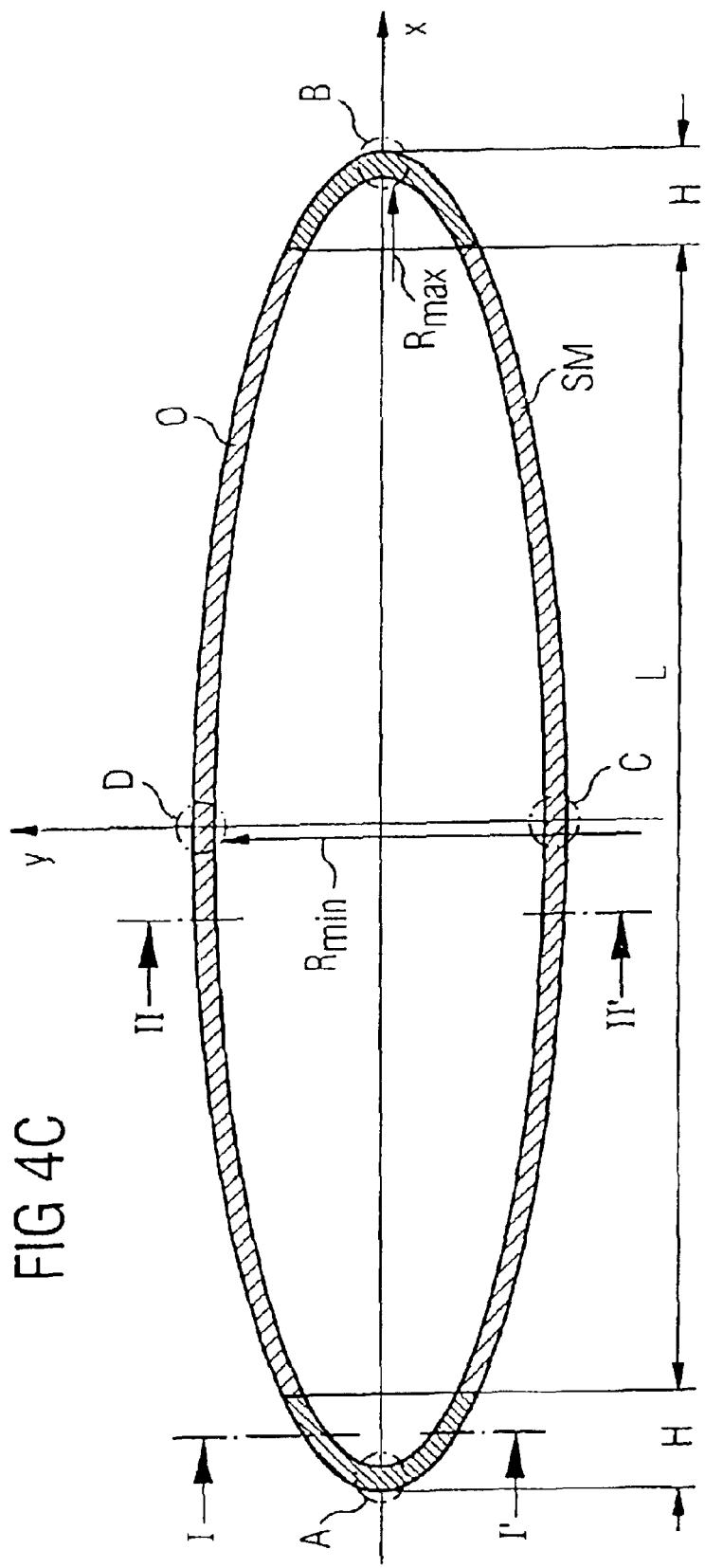

I-I'

II-II'

II-II'

I-I'

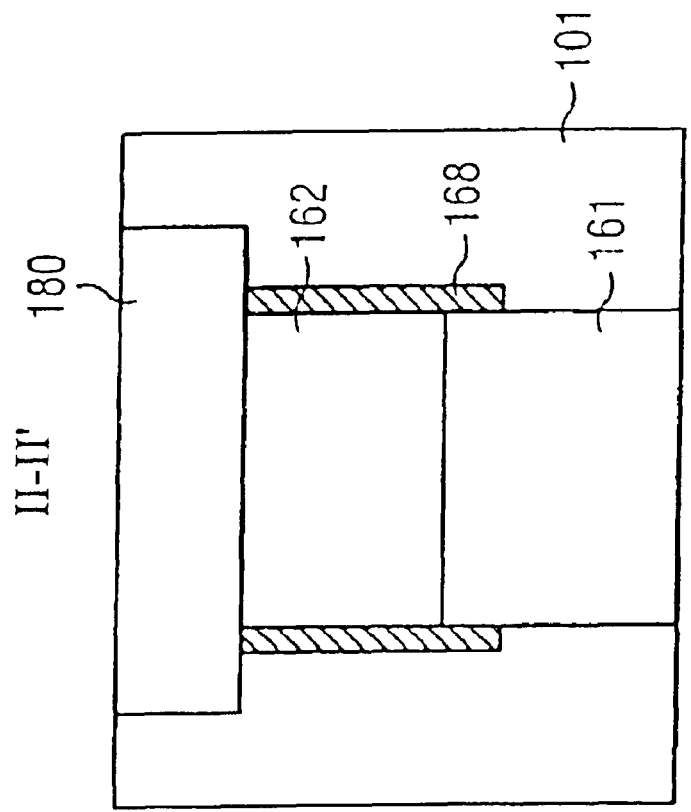
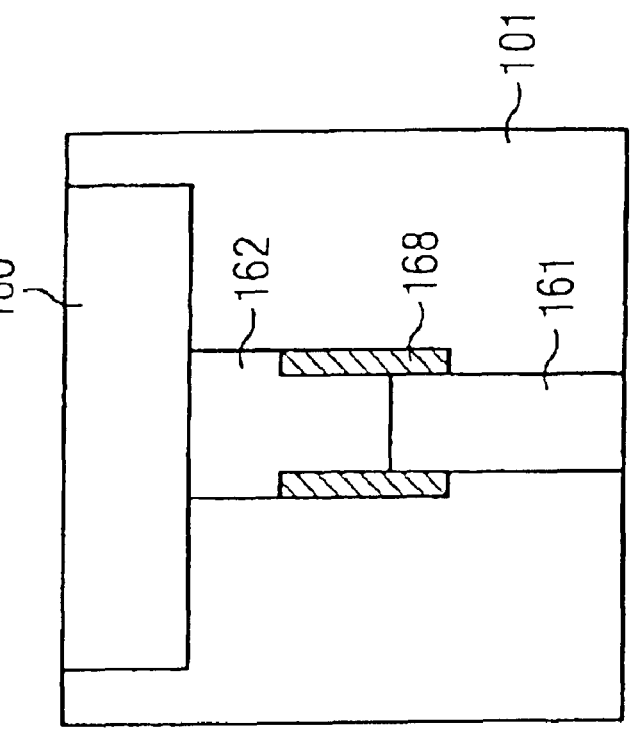

METHOD FOR FABRICATING SELF-ALIGNING MASK LAYERS

BACKGROUND OF THE INVENTION

Field of the Invention

The present invention relates to a method for fabricating self-aligning mask layers and, in particular, to a method for fabricating an undensified conformal mask layer that has different etching rates or a self-aligning etching-back on account of a different mechanical stress.

To elucidate the invention, the latter is described using a method for fabricating a trench capacitor, as is used in semiconductor memory cells of integrated semiconductor circuits. However, the invention can be applied in the same way generally to microelectronic, micromechanical, and also combinations of microelectronic and micromechanical systems with such self-aligning etching-back.

To illustrate the present invention, firstly a description is given of a conventional method for fabricating a trench capacitor in a dynamic semiconductor memory cell of a dynamic memory DRAM.

FIG. 1 shows a conventional trench capacitor as is used, in particular, in a DRAM semiconductor memory cell and is disclosed in U.S. Pat. No. 5,945,704 to Schrems et al., for example. Such a DRAM semiconductor memory cell substantially includes a capacitor 160, which is formed in a substrate 101. The substrate 101 is lightly doped, for example, with p-type dopants such as boron, for example. A trench is usually filled with polysilicon 161, which is heavily $n^+$-doped with arsenic or phosphorus, for example. A buried plate 165 doped with arsenic, for example, is situated in the substrate 101 at a lower region of the trench. The arsenic or the dopant is usually diffused into the silicon substrate 101 from a dopant source such as, e.g., an arsenosilicate glass ASG formed at the sidewalls of the trench. In this case, the polysilicon 161 and the buried plate 165 serve as electrodes of the capacitor 160, a dielectric layer 164 separating the electrodes of the capacitor from one another.

The DRAM semiconductor memory cell in accordance with FIG. 1 furthermore has a field-effect transistor 110. The transistor 110, usually referred to as a selection transistor, has a gate 112 and diffusion regions 113 and 114 as source and drain. The diffusion regions, which are spaced apart from one another by a channel 117, are usually formed by the implantation of dopants such as, e.g., phosphorus. Furthermore, a contact diffusion region 125 is formed in the semiconductor substrate 101, which connects the capacitor 160 to the selection transistor 110 through, for example, a further electrically conductive filling layer 162.

An insulation collar 168 is formed at an upper section or upper region of the trench. In this case, the insulation collar 168 prevents a leakage current from the contact diffusion region 125 to the buried plate 165. Such a leakage current is undesirable, in particular, in memory circuits, because it reduces the charge retention time, or retention time, of a semiconductor memory cell.

In accordance with FIG. 1, the conventional semiconductor memory cell with trench capacitor furthermore has a buried well or layer 170, the peak concentration of the dopants in the buried n-type well lying approximately in the lower end of the insulation collar 168. The buried well or layer 170 substantially serves for connecting the buried plates 165 of a multiplicity of adjacent DRAM semiconductor memory cells or capacitors 160 in the carrier substrate 101, which is preferably composed of silicon semiconductor material.

An activation of the selection transistor 110 by application of a suitable voltage to the gate 112 substantially enables access to the trench capacitor 160, the gate 112 usually being connected to a word line 120 and the diffusion region 113 to a bit line 185 in the DRAM array. In this case, the bit line 185 is isolated from the diffusion region 113 by a dielectric insulation layer 189 and electrically connected through a contact 183.

Furthermore, to isolate a respective semiconductor memory cell with associated trench capacitor from adjoining cells, a hallow trench isolation (STI) 180 is formed at the surface of the semiconductor substrate 101. In accordance with FIG. 1, by way of example, the word line 120 can be formed above the trench and in a manner isolated by the shallow trench isolation (STI). As a result, so-called folded bit line architecture is obtained.

As such, a semiconductor memory cell is obtained that has a minimal space requirement and is, thus, optimally suited to large-scale integrated circuits.

What is disadvantageous, however, in the case of such a conventional semiconductor memory cell is that the insulation collar 168 is usually disposed only in the same height around the trench and, consequently, undesirable leakage currents into the semiconductor substrate 101 can still occur in a connection region AB.

In principle, the insulation collar 168 could also be raised in a stepped manner in its other regions to release only the connection diffusion region 125, but additional and costly photolithographic steps and etching steps have to be employed. These steps are very complicated and cost-intensive, however, particularly in the case of large scale integrated circuits, on account of so-called overlay problems and "critical dimension" tolerances.

SUMMARY OF THE INVENTION

It is accordingly an object of the invention to provide a method for fabricating self-aligning mask layers that overcomes the hereinafore-mentioned disadvantages of the heretofore-known devices and methods of this general type and that permits fabrication of microelectronic and micromechanical systems simply and cost-effectively.

With the foregoing and other objects in view, there is provided, in accordance with the invention, a method for fabricating a self-aligning mask layer, including the steps of (a) forming a surface to be masked in a carrier substrate, the surface having different radii of curvature, (b) forming an undensified conformal insulation layer on the surface to produce, due to the different radii of curvature, regions with different mechanical stress in the conformal insulation layer, and (c) etching to remove partial regions of the conformal insulation layer in a manner dependent on the different mechanical stress in the conformal insulation layer.

In particular, the invention provides a method for fabricating a self-aligning mask layer in which the above-described insulation collar is formed in a particularly simple and cost-effective manner so as to produce a reduced leakage current and improved charge retention properties.

In particular by virtue of forming a surface to be masked in a carrier substrate, the surface having different radii of curvature, and subsequently forming an undensified conformal insulation layer on the surface such that, on account of the different radii of curvature, regions with different mechanical stress are produced in the insulation layer, it is possible, in the course of an etching that is subsequently carried out, on account of an established etching rate dependence of partial regions of the insulation layer with different mechanical stress, to realize a sublithographic patterning, for example, for the formation of contact regions.

In accordance with another mode of the invention, step (a) is carried out by forming a trench in the carrier substrate. The surface to be masked constitutes a trench surface.

In accordance with a further mode of the invention, step (b) is carried out by forming, as the conformal insulation layer, at least one of undensified oxides and glasses based on silicon oxide.

Preferably, an undensified oxide and/or glasses based on silicon oxide, such as, for example, BPSG, PSG, and spin-on glasses, are formed as the conformal insulation layer. Such materials or layers exhibit a high dependence of their inner mechanical stress with regard to a surface structure to be masked. By the selection of respective radii of curvature on the surface to be masked, sublithographic structures can, thus, be realized particularly simply and cost-effectively.

In accordance with an additional mode of the invention, step (b) is carried out by depositing an ozone-TEOS oxide as the conformal insulation layer.

In accordance with yet another mode of the invention, preferably, ozone-TEOS oxide is deposited as the conformal insulation layer in a CVD method at a pressure of approximately 40 torr, a temperature of approximately 400 degrees Celsius, and an ozone flow of approximately 4000 sccm, the TEOS quantity being approximately 800 mg/min. Such a conformally deposited insulation layer has, as self-aligning mask layer, extraordinarily favorable dependencies between a respective etching rate and the associated mechanical stress or an underlying radius of curvature of the surface structure.

In accordance with yet a further mode of the invention, preferably, after the etching-back of the self-aligning mask layer or conformal insulation layer, it is possible to carry out a densification at, for example, a temperature of from 850 to 1000 degrees Celsius in a nitrogen and/or nitrogen/oxygen atmosphere, this yielding, for further method steps, an independence of the etching rate of the self-aligning mask layer dependent upon the mechanical stress or the underlying curvature of the surface to be masked. The structures in the self-aligning mask layer, once they have been set, can, thus, be fixed for later method steps.

In accordance with yet an added mode of the invention, the densification is carried out in a furnace or an RTP process.

In accordance with yet an additional mode of the invention, preferably, an isotropic wet etching that has a BHF etching using $NH_4F/HF/H_2$ in the ratio of 10/2/90 at room temperature, in particular, at approximately 20 degrees Celsius, is carried out as the etching-back of the conformal insulation layer. Such an isotropic wet etching exhibits a particularly high selectivity of the etching rates in the self-aligning mask layer in dependence on the mechanical stress. A time duration and associated stress of other elements are, thus, kept low. Furthermore, a standard etching method that is usually available is involved.

In accordance with again another mode of the invention, the surface to be masked has a surface sectional view in an elliptical form; in other words, the surface to be masked has an elliptical cross-section.

In accordance with again a further mode of the invention, in the case of a ratio $R_{max}/R_{min} \leq 1/8$, where $R_{max}$ represents the radius of curvature with maximum mechanical stress and $R_{min}$ the radius of curvature with minimum mechanical stress in the mask layer, a sufficiently high selectivity is obtained for the etching-back of the mask or insulation layer, thereby resulting in a significant patterning.

In accordance with a concomitant mode of the invention, the self-aligning mask layer forms a contact between a trench capacitor and a selection transistor in a DRAM memory cell.

Other features or modes that are considered as characteristic for the invention are set forth in the appended claims.

Although the invention is illustrated and described herein as embodied in a method for fabricating self-aligning mask layers, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1 is a simplified, diagrammatic cross-sectional view of a prior art semiconductor memory cell with a trench capacitor;

FIG. 2 is a simplified, diagrammatic cross-sectional view of a semiconductor memory cell with trench capacitor and insulation collar formed according to the invention;

FIG. 3C is a simplified, diagrammatic cross-sectional view of a surface for illustrating a first method step according to the invention;

FIG. 4A is a simplified, diagrammatic cross-sectional view of the surface in FIG. 4C along section line I–I';

FIG. 4B is a simplified, diagrammatic cross-sectional view of the surface in FIG. 4C along section line II–II';

FIG. 4C is a simplified, diagrammatic cross-sectional view of a surface for illustrating a further method step according to the invention;

FIG. 7A is a simplified, diagrammatic cross-sectional view of the surface in FIG. 4C along section line I–I' in a further different method step;

FIG. 7B is a simplified, diagrammatic cross-sectional view of the surface in FIG. 4C along section line II–II' in the method step of FIG. 7A.

DESCRIPTION OF THE PREFERRED EMBODIMENTS

In the figures of the drawings, unless stated otherwise, identical reference symbols denote identical parts.

The invention is described below using a DRAM semiconductor memory cell, an insulation collar, for example, being formed and patterned as self-aligning mask layer.

Referring now to the figures of the drawings in detail and first, particularly to FIG. 2 thereof, there is shown a simplified cross-sectional view of a semiconductor memory cell with trench capacitor and insulation collar formed according to the invention.

To avoid the leakage currents described in the introduction and to improve the charge retention properties in the semiconductor memory cell, the insulation collar 168 is formed by a fabrication method described below, an insulation collar structure (illustrated by broken lines) being realized in particular in the connection region AB in accordance with FIG. 2.

Accordingly, in accordance with FIG. 2, the insulation collar 168 does not have a uniform height, rather its actual height varies in a y direction according to the insulation collar structure illustrated by broken lines. Accordingly, the insulation collar 168 is fully opened only in a small region directed toward the contact diffusion region 125, while in its further y directions, it substantially rises and encloses the contact filling material 162 virtually completely, thereby producing further improved charge retention properties and reduced leakage currents.

For illustration purposes, method steps for fabricating such a self-aligning mask layer are described by way of example below.

Figure 3B:
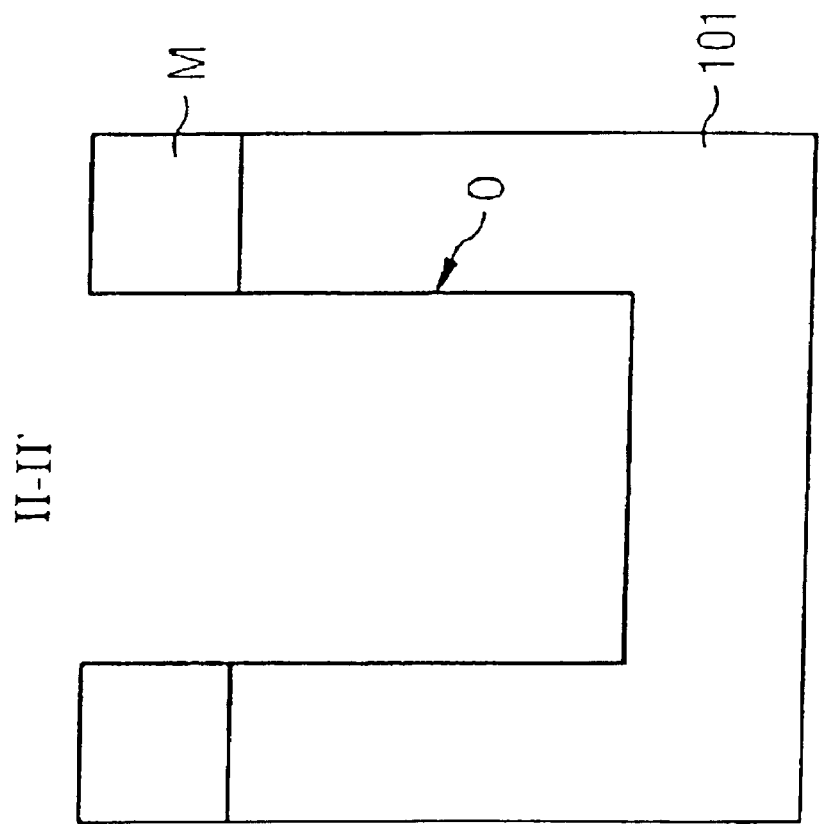
FIG. 3B is a simplified, diagrammatic cross-sectional view of the surface in FIG. 3C along section line II–II'.
Figure 3A:
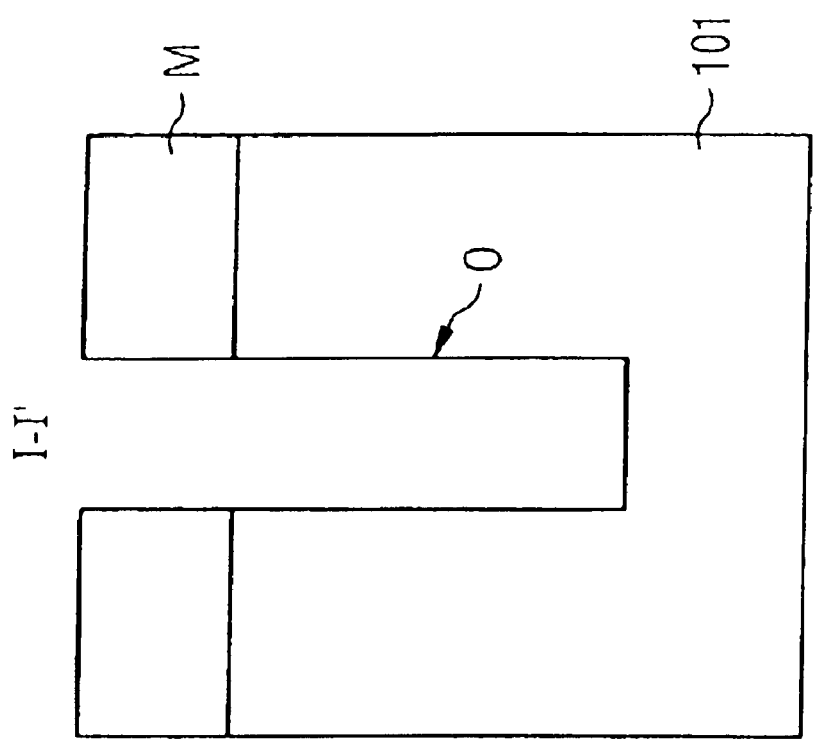
FIG. 3A is a simplified, diagrammatic cross-sectional view of the surface in FIG. 3C along section line I–I'.

FIGS. 3A to 3C show simplified cross-sectional views along a sectional axis I–I', II–II' and along a surface or x-y plane of a carrier substrate for illustrating an early method step according to the present invention.

In accordance with FIGS. 3A to 3C, firstly a mask layer M, which has a photoresist, for example, is applied on a carrier substrate 101, which may constitute any desired material and preferably includes a semiconductor material or silicon. As an alternative, the mask layer M may have a so-called antireflective coating (ARC) layer with a photoresist or a hard mask with an ARC layer and a photoresist.

The mask or the mask layer stack M is patterned by conventional lithographic methods and etching processes that may be necessary (for the ARC and/or hard mask layer). The structure of the mask layer M is subsequently transferred into the carrier substrate 101 by a suitable etching, a surface O to be masked thereby being formed in the carrier substrate 101. In accordance with FIGS. 3A to 3C, the surface O to be masked is a trench surface of a trench formed in the carrier substrate 101.

The form of the surface O to be masked is now important to the invention's method for fabricating self-aligning mask layers. More precisely, the surface O to be masked in the carrier substrate 101 must be formed so as to produce different radii $R_{min}$ to $R_{max}$ of curvature.

In accordance with FIG. 3C a surface sectional view or sectional view in the x-y plane of the trench has an elliptical form, the vertices A and B of the ellipse having a radius $R_{max}$ of curvature and the vertices C and D having a radius $R_{min}$ of curvature. FIGS. 3A and 3B show the associated sectional views along the sectional lines I–I' and II–II' in accordance with FIG. 3C. As an alternative, however, it is also possible to use any other structures as surface structures to be masked.

FIGS. 4A to 4C show simplified cross-sectional views along a sectional axis I–I', II–II' and a surface or x-y plane for illustrating a further method step, identical reference symbols again designating layers or elements identical or corresponding to those in FIGS. 3A to 3C and a repeated description being dispensed with.

In accordance with FIGS. 4A to 4C, in this method step, an undensified conformal insulation layer SM is now formed at the surface O of the carrier substrate 101 such that, on account of the different radii $R_{min}$ to $R_{max}$ of curvature, regions with different mechanical stress are produced in the insulation layer SM. More precisely, in accordance with FIG. 4C, an undensified conformal insulation layer SM with low mechanical stress is formed in a region L on account of the underlying radii of curvature, while the insulation layer SM with high mechanical stress is formed in the regions H, i.e., the regions with small radii of curvature.

By way of example, the conformal insulation layer SM formed is an undensified oxide and/or a glass based on silicon oxide, such as, for example, borophosphosilicate (BPSG) glass, phosphosilicate (PSG) glass, spin-on glass, etc., which has such a radius of curvature-dependent property with regard to its mechanical stress. In such a case, a conformal layer or layer formed conformally is to be understood as a layer with a constant layer thickness that substantially has the same surface structure as an underlying foundation layer, i.e., the surface O to be masked.

Preferably, in the step in accordance with FIGS. 4A to 4C, by a chemical vapor deposition (CVD) method an ozone-TEOS oxide is deposited as the conformal insulation layer SM in a conventional CVD chamber at a pressure of approximately 40 torr, a susceptor temperature of, for example, 400 degrees Celsius, and an ozone flow of approximately 4000 sccm. The tetraethyl orthosilicate (TEOS) quantity is approximately 800 mg/min.

After this conformal oxide deposition, an etching-back step may optionally be necessary in order, for example, to remove the self-aligning mask layer or the conformal insulation layer SM outside the surface structure O to be masked. As an alternative, so-called lift-off processes can also be employed.

It should be emphasized particularly when using ozone-TEOS oxide that the oxide is deposited or annealed in a manner such that it is not yet completely densified because, otherwise, an etching rate selectivity in dependence on a mechanical stress in the layer is lost. Depending on the process control, the deposition can also be effected prior to the removal of the mask layer or of the mask layer stack M or individual layers thereof.

What is significant to the present fabrication method is, independently of the concrete choice of process, the formation of an undensified conformal insulation layer having different radii of curvature according to its foundation or surface O to be masked. In such a case, again, depending on the process variant chosen, the oxide layer SM may be preserved only in the structures that are perpendicular or at a different angle greater than zero degrees with respect to the substrate surface, or, as an alternative thereto, may also be preserved on the structure layers running parallel to the substrate surface. A further processing is also possible or necessary, in particular, for the realization of an insulation collar 168.

Figure 5A:
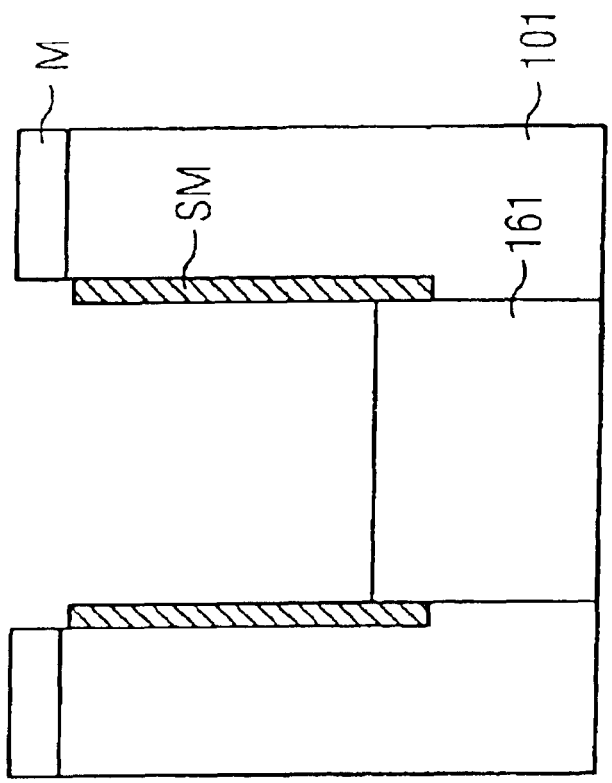
FIG. 5A is a simplified, diagrammatic cross-sectional view of the surface in FIG. 4C along section line I–I' in another method step.
Figure 5B:
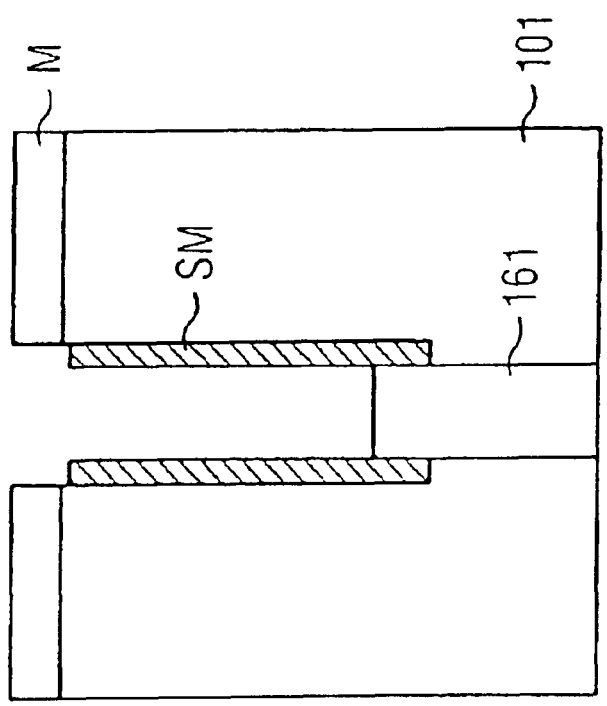
FIG. 5B is a simplified, diagrammatic cross-sectional view of the surface in FIG. 4C along section line II–II' in the method step of FIG. 5A.

FIGS. 5A and 5B show simplified cross-sectional views along a sectional axis I–I' and II–II', respectively. For illustrating such a further method step, identical reference symbols designating elements or layers identical or corresponding to those in FIGS. 3 to 4 and a repeated description are dispensed with below.

In accordance with FIGS. 5A and 5B, to form a trench capacitor, for example, the conformal insulation layer or self-aligning mask layer SM is firstly etched anisotropically, the trench bottom thereby being uncovered. Afterward, an actual trench is formed in the carrier substrate 101 and filled with the polysilicon filling layer 161. To simplify the illustration, the dielectric layer 164 situated between the carrier substrate and the polysilicon filling layer 161 has been omitted. Up to this point in time, the self-aligning mask layer is no different than a conventionally formed mask layer.

Figure 6B:
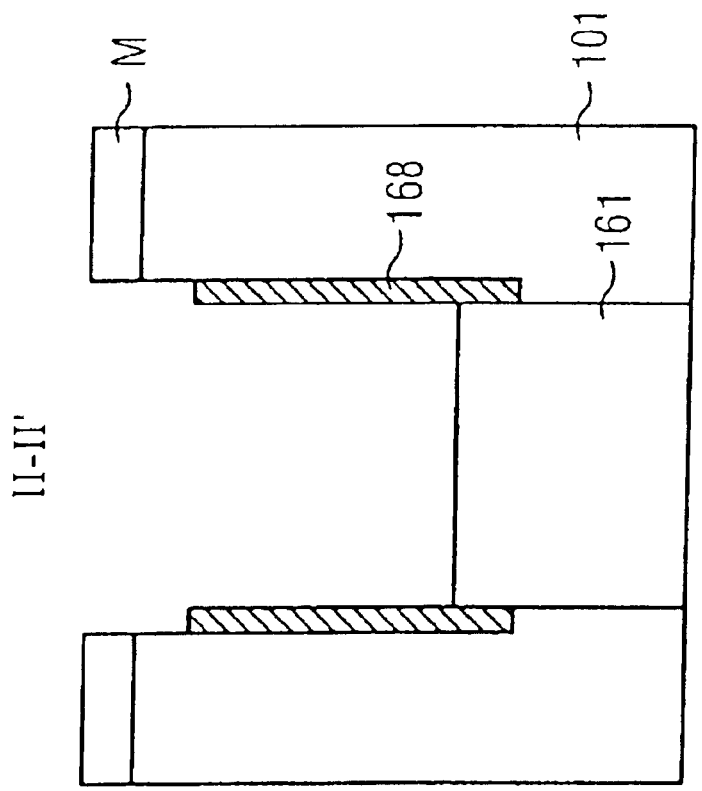
FIG. 6B is a simplified, diagrammatic cross-sectional view of the surface in FIG. 4C along section line II–II' in the method step of FIG. 6A.
Figure 6A:
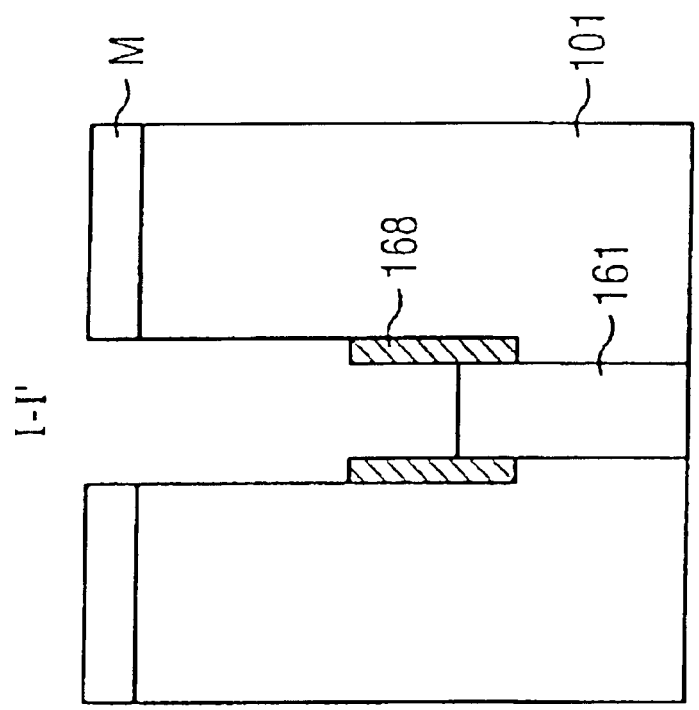
FIG. 6A is a simplified, diagrammatic cross-sectional view of the surface in FIG. 4C along section line I–I' in another different method step.

FIGS. 6A and 6B show simplified cross-sectional views along a sectional axis I–I' and II–II', respectively. For illustrating a self-aligning etching-back step, identical reference symbols again representing layers identical or corresponding to those in FIGS. 3 to 5 and a repeated description are dispensed with below.

In accordance with FIGS. 6A and 6B, a self-aligning etching-back now takes place for removing partial regions of the insulation layer or self-aligning mask layer SM in a manner dependent on the different mechanical stress in the insulation layer. Accordingly, in accordance with FIG. 6A, the self-aligning mask layer SM is etched back to a significantly greater extent in the region H with high mechanical stress, on account of the small radius of curvature, than the same layer in the region L with low mechanical stress, on account of a large radius of curvature. Such an etching may be either an adequate wet etching or a dry-chemical, possibly plasma-assisted etching. What is important is that the desired etching rate differences in dependence on the radius of curvature of the structure to be masked, or the trench surface O, emerge as a result of the etching.

The etching-back is preferably effected wet chemically as a BHF etching step using $NH_4F/HF/H_2$ in the ratio of 10/2/90 at approximately 20 degrees Celsius. In such a case, the etching rate is approximately 20 nm/minute on blank wafers. A sufficient selectivity of the etching-back on account of the different mechanical stress or the different underlying radii of curvature is obtained if a ratio $R_{max}/R_{min}$ is $\leq 1/8$, where $R_{max}$ is the radius of curvature with maximum mechanical stress and $R_{min}$ the radius of curvature with minimum mechanical stress in the insulation layer or self-aligning mask layer SM. Preferably, an elliptical form of the trench in the x-y plane is chosen particularly in the case of the formation of DRAM semiconductor memory cells.

After the etching-back of the self-aligning mask layer, densification of the layer can be carried out, densification or annealing being effected preferably at a temperature of from approximately 850 degrees Celsius to 1000 degrees Celsius in a nitrogen and/or nitrogen/oxygen atmosphere. The densification is carried out, for example, in a furnace process or an RTP process (rapid thermal process). The insulation collar 168 illustrated in FIGS. 6A and 6B is obtained in this way, which insulation collar, on account of its densification, now has no or only very slight etching rate differences in dependence on the mechanical stress or the underlying geometry (radius of curvature). Accordingly, more extensive processing can be carried out without altering the structure or respective heights and depths of the insulation collar 168.

FIGS. 7A and 7B show simplified cross-sectional views along a sectional axis I–I' and II–II', respectively. For illustrating further method steps, identical reference symbols designating elements or layers identical or corresponding to those in FIGS. 3 to 6 and a repeated description are dispensed with below.

In accordance with FIGS. 7A and 7B, the trench can now be filled with a further electrically conductive filling layer 162 to realize a connection contact to the contact diffusion region 125, a shallow trench isolation (STI) 180 preventing unintentional contact connection to the carrier substrate 101. As such, given an appropriate configuration, a contact with the carrier substrate 101 is obtained only at the location of the selection transistor 110 or of the contact diffusion region 125, while the remaining region is completely enclosed by the insulation collar 168. As a result, leakage currents can be reduced further, for which reason a charge retention time, in particular, in semiconductor memory cells, is improved.

Consequently, with the fabrication method described above, process steps and costs can be saved. In particular, lithography, alignment, and feature size control steps and also etching processes, resist incineration, cleaning processes, etc. are able to be obviated. In particular, on account of the self-alignment, a size of a contact region, for example, and also its positioning may be significantly smaller and more accurate, respectively, than has usually been able to be realized using lithographic methods.

The invention has been described above using a DRAM semiconductor memory cell with an insulation collar. However, it is not restricted thereto, but rather includes all further methods for fabricating microelectronic and/or micromechanical components in which a self-aligning mask layer is used.

I claim:

1. A method for fabricating a self-aligning mask layer, which comprises:
    a) forming a surface to be masked in a carrier substrate, the surface having different radii, of curvature;
    b) forming an undensified conformal insulation layer on the surface to produce, due to the different radii of curvature, regions with different mechanical stress in the conformal insulation layer; and
    c) etching to remove partial regions of the conformal insulation layer in a manner dependent on the different mechanical stress in the conformal insulation layer.

2. The method according to claim 1, which further comprises carrying out step a) by forming a trench in the carrier substrate, the surface to be masked constituting a trench surface.

3. The method according to claim 1, which further comprises carrying out step b), by forming, as the conformal insulation layer, at least one of undensified oxides and glasses based on silicon oxide.

4. The method according to claim 3, wherein the glasses are selected from the group consisting of BPSG, PSG, and spin-on glasses.

5. The method according to claim 2, which further comprises carrying out step b), by forming, as the conformal insulation layer, at least one of undensified oxides and glasses based on silicon oxide.

6. The method according to claim 5, wherein the glasses are selected from the group consisting of BPSG, PSG, and spin-on glasses.

7. The method according to claim 1, which further comprises carrying out step b) by depositing an ozone-TEOS oxide as the conformal insulation layer.

8. The method according to claim 7, which further comprises depositing the ozone-TEOS oxide by a CVD method at a pressure of approximately 40 torr, a temperature of approximately 400 degrees Celsius, and an ozone flow of approximately 4000 sccm, with a TEOS quantity being approximately 800 mg/min.

9. The method according to claim 1, which further comprises densifying the conformal insulation layer.

10. The method according to claim 9, which further comprises carrying out the densification at a temperature between approximately 850 degrees Celsius and approximately 1000 degrees Celsius in at least one of a nitrogen atmosphere and a mixed nitrogen/oxygen atmosphere.

11. The method according to claim 9, which further comprises carrying out the densification in one of a furnace and an RTP process.

12. The method according to claim 10, which further comprises carrying out the densification in one of a furnace and an RTP process.

13. The method according to claim 1, which further comprises carrying out the etching step with an isotropic wet etching.

14. The method according to claim 13, which further comprises carrying out the etching step with a BHF etching using $NH_4F/HF/H_2$ in a ratio of 10/2/90 at approximately 20 degrees Celsius.

15. The method according to claim 1, wherein the surface to be masked has a surface sectional view in an elliptical form.

16. The method according to claim 1, wherein the surface to be masked has an elliptical cross-section.

17. The method according to claim 1, wherein the radii of curvature have a ratio $R_{max}/R_{min}$ of $\leq 1/8$, where:

$R_{max}$ is the radius of curvature with maximum mechanical stress in the insulation layer; and $R_{min}$ is the radius of curvature with minimum mechanical stress in the insulation layer.

18. The method according to claim 1, wherein the surface having different radii of curvature with a ratio $R_{max}/R_{min}$ of $\leq 1/8$, where:

$R_{max}$ is the radius of curvature with maximum mechanical stress in the insulation layer; and $R_{min}$ is the radius of curvature with minimum mechanical stress in the insulation layer.

19. The method according to claim 1, wherein the self-aligning mask layer forms a contact between a trench capacitor and a selection transistor in a DRAM memory cell.

20. A method of forming a contact between a trench capacitor and a selection transistor in a DRAM memory cell, which comprises:

fabricating a self-aligning mask layer by:
forming a surface to be masked in a carrier substrate, the surface having different radii of curvature;
forming an undensified conformal insulation layer on the surface to produce, due to the different radii of curvature, regions with different mechanical stress in the conformal insulation layer; and
etching to remove partial regions of the conformal insulation layer in a manner dependent on the different mechanical stress in the conformal insulation layer.

21. A method of fabricating a self-aligning mask layer in a memory cell, which comprises:

providing a DRAM memory cell having a trench capacitor and a selection transistor; and fabricating a self-aligning mask layer to form a contact between the trench capacitor and the selection transistor by:
forming a surface to be masked in a carrier substrate, the surface having different radii of curvature;
forming an undensified conformal insulation layer on the surface to produce, due to the different radii of curvature, regions with different mechanical stress in the conformal insulation layer; and
etching to remove partial regions of the conformal insulation layer in a manner dependent on the different mechanical stress in the conformal insulation layer.

* * * * *